(12) United States Patent
Sanders (10) Patent No.: US 7,142,008 B1
(45) Date of Patent: Nov. 28, 2006

(54) METHOD AND APPARATUS FOR CLOCK DIVISION ON A PROGRAMMABLE LOGIC DEVICE

(75) Inventor: Lester S. Sanders, Albuquerque, NM (US)

(73) Assignee: Xilinx, Inc., San Jose, CA (US)

( * ) Notice: Subject to any disclaimer, the term of this patent is extended or adjusted under 35 U.S.C. 154(b) by 232 days.

(21) Appl. No.: 10/732,508

(22) Filed: Dec. 9, 2003

(51) Int. Cl.
*H03K 19/173* (2006.01)
*G06F 1/04* (2006.01)

(52) U.S. Cl. .......................... 326/38; 326/47; 327/298

(58) Field of Classification Search ............ 326/37–39, 326/41, 47; 327/291, 298, 113–115
See application file for complete search history.

(56) References Cited

U.S. PATENT DOCUMENTS 5,302,866 A * 4/1994 Chiang et al. ................ 326/40
6,218,876 B1 * 4/2001 Sung et al. .................. 327/156

OTHER PUBLICATIONS

Altera Corporation; "Using the ClockLock and ClockBoost PLL Features"; Application Note 116; Nov. 2003, ver 2.6; available from Altera Corporation at http://www.altera.com/literature/lit-an.jsp; pp. 1-56.
Xilinz, Inc.; "Using the Virtex Delay-Locked Loop"; XAPP132 (2.8) Jan. 5, 2006; available from Xilinx, Inc. at http://www._xilinx.com/xlnx/xweb/xil_publications_showall.jsp?sGlobalNavPick=&sSecondaryNavPick=&category=-1209827&iLanguageID=1; pp. 1-16.

* cited by examiner

*Primary Examiner*—James H. Cho
(74) *Attorney, Agent, or Firm*—LeRoy D. Maunu; Kim Kanzaki (57) ABSTRACT

According to one example embodiment, a complex, programmable logic device (CPLD-type) has logic blocks and Input/Output (I/O) pads interconnected via a programmable interconnect array. A dedicated logic block is directly coupled to I/O pads, which provides external access to the dedicated logic block without traversing the programmable interconnect array. The dedicated logic block may include a clock divider module for providing a divided clock to the CPLD.

13 Claims, 7 Drawing Sheets

METHOD AND APPARATUS FOR CLOCK DIVISION ON A PROGRAMMABLE LOGIC DEVICE

FIELD OF THE INVENTION

The present invention generally relates to programmable logic devices, and more particularly to medium scale programmable logic devices that incorporate task-specific circuits.

BACKGROUND

Prompted by the development of new types of sophisticated Field Programmable Devices (FPDs), the process of designing digital hardware has changed dramatically over the past few years. Unlike previous generations of technology, in which board level designs included large numbers of Small Scale Integration (SSI) chips containing basic gates, virtually every digital design that is produced today consists substantially of high density devices. High density devices are not only used for custom devices like processors and memory, but also for logic circuits such as Finite State Machines (FSM), counters, registers, and decoders.

High density gate arrays have been used to implement FPD functions when targeted for high volume systems, however, gate array Non-Recoverable Engineering (NRE) expenses and development schedules often preclude their use in prototyping, or other low volume implementations. For these reasons, most prototypes, as well as an increasing number of production designs, are now implemented with FPDs. Some of the most compelling advantages realized when using FPDs are: instant manufacturing turnaround; low startup costs; low financial risk; and ease of design change. Design changes are easily implemented by the end user through the use of Computer Aided Design (CAD) tools, which include software for the following exemplary tasks: initial design entry; logic optimization; device fitting; simulation; and configuration.

Clock division, for example, is a common function that is often programmed by the end user of an FPD. Clock division can also involve the use of a dedicated, programmable clock divider, to perform fixed divide-by ratios between (for example, ÷2 and ÷16), to generate a finite set of clock rates. In an FPD, the user programmable logic portion of the FPD may be utilized by the end user for clock division. The user programmable logic portion of an FPD may be implemented, for example, through the use of: the Configurable Logic Blocks (CLB) and Input/Output (I/O) blocks in Field Programmable Gate Arrays (FPGA); or by the Product Term Array (PTA) and macrocell arrangement of the Complex Programmable Logic Device (CPLD). If the user requires divide-by ratios in excess of the finite set of clock rates, for example, the complexity of the programmable logic increases dramatically.

Historically, dedicated clock dividers have primarily been provided on FPGAs. Consequently, the CPLD user wishing to implement clock division is faced with a dilemma: either use a portion of the available macrocells on the CPLD to implement the clock divider, or change over to an FPGA to realize his particular design. In many instances, however, use of the FPGA is cost prohibitive, whereas utilizing macrocells within a CPLD is an inefficient use of user programmable logic. Today's logic designer is in need of additional design solutions that provides both efficient use of hardware resources, while allowing adequate cost control.

Accordingly, there is a need in the programmable logic device industry to provide the circuit designer with such options not currently offered in FPD designs.

An apparatus and method that addresses the aforementioned problems, as well as other related problems, are therefore desirable.

SUMMARY OF THE INVENTION

Various embodiments of the present invention are directed to a programmable logic device that addresses the aforementioned problems for those and other applications. In more particular embodiments, the invention is directed to FPD designs that include internalization of dedicated logic blocks, such as dedicated clock dividers, along with enhanced connectivity to the dedicated logic blocks, so that the circuit designer may incorporate added versatility and functionality into system level applications of the FPDs.

According to one embodiment, an integrated circuit having a plurality of Input/Output (I/O) pins and a programmable logic device is coupled to the I/O pins to provide dedicated and configurable logic functions. The programmable logic device comprises a plurality of logic blocks coupled to receive first input signals from the I/O pins and is coupled to provide first output signals having a logical relationship to the first input signals in accordance with a user defined configuration, a programmable interconnect array coupled to receive the first output signals and coupled to distribute the first output signals in accordance with the user defined configuration, and a dedicated logic block coupled to receive second input signals from the I/O pins and coupled to provide second output signals in accordance with the dedicated function. The second input and output signals bypass the programmable interconnect array.

According to another embodiment, in a Complex Programmable Logic Device (CPLD), a dedicated clock divider module is coupled to receive an input clock signal and a clock enable signal and is coupled to provide a divided clock signal. The dedicated clock divider module comprises a first multiplexer coupled to receive internal and external input clock signals and is arranged to select between the internal and external input clock signals in response to a first select signal, a second multiplexer is coupled to receive internal and external clock enable signals and arranged to select between the internal and external clock enable signals in response to a second select signal, and an output block is coupled to receive a clock signal selected by the first select signal and is coupled to provide the divided clock signal in response to the selected clock enable signal. The first and second select signals are generated by internal user programmable logic.

According to yet another embodiment, a method of providing a divided clock signal from a dedicated clock divider contained within a programmable logic device is realized. The method comprises selecting between clock signals that are internal and external to the programmable logic device, applying the selected clock signal to the dedicated clock divider, and providing the divided clock signal by enabling the dedicated clock divider through selection of one of internal or external clock enable signals. Applying the selected clock signal and providing the divided clock signal bypasses a programmable interconnect array contained within the programmable logic device.

According to yet another embodiment, a Programmable Logic Device (PLD) comprises Input/Output (I/O) pads, logic blocks, and a programmable interconnect array. The PLD comprises means for selecting between a clock signal generated internally to the PLD and a clock signal received external to the PLD via a first I/O pad, means for selecting between a clock enable signal generated internally to the PLD and a clock enable signal received external to the PLD via a second I/O pad, and means for generating a divided clock signal from the selected clock signal in response to the selected enable signal. The selected clock signal and the divided clock signal bypass the programmable interconnect array.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

Various embodiments of the present invention are described in terms of programmable logic devices. Specific embodiments of programmable logic devices are exemplified using modified technology that may be associated with medium scale FPDs such as CPLDs. Those skilled in the art, however, will appreciate that the invention could be implemented in other programmable logic devices such as FPGAs, Programmable Logic Arrays (PLA), or Programmable Array Logic (PAL) to name only a few.

Figure 1:
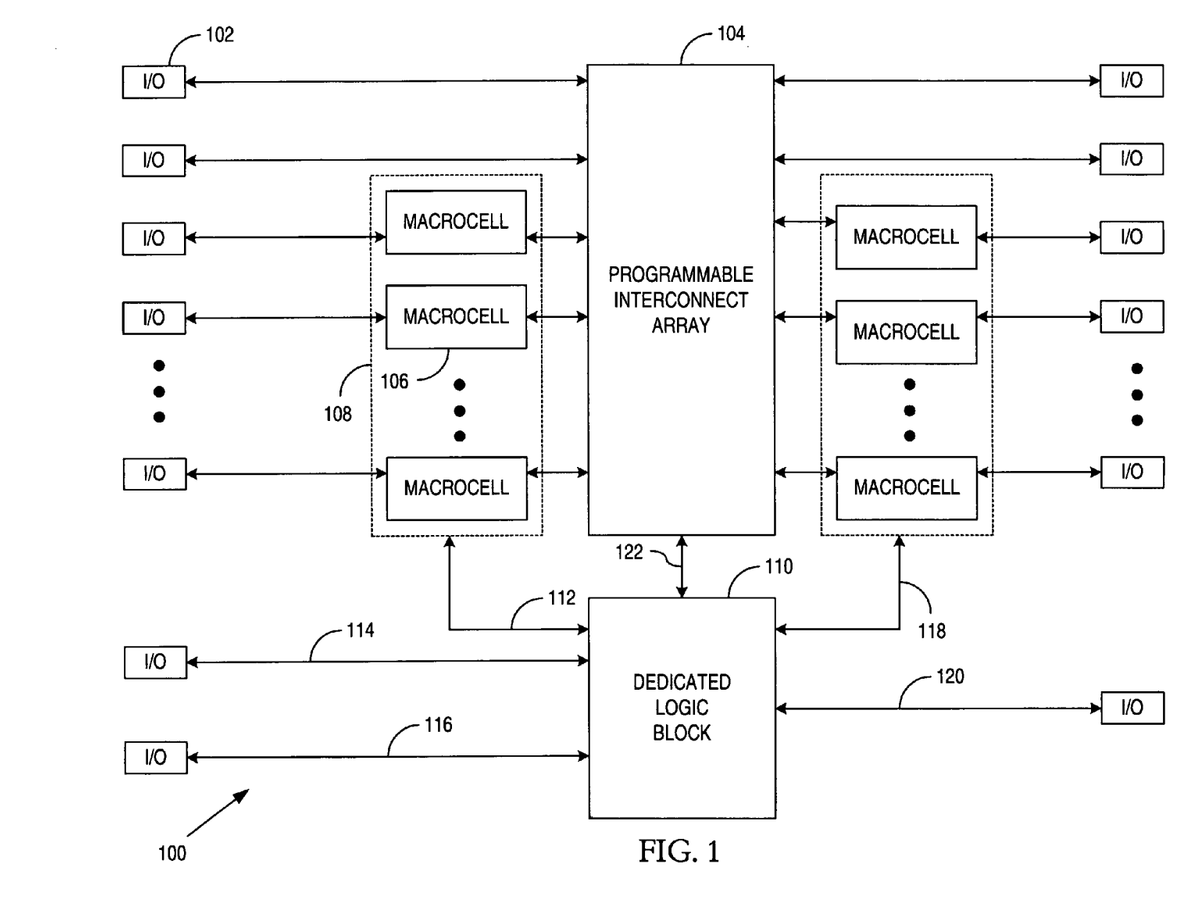
FIG. 1 illustrates a block diagram of an exemplary Field Programmable Device (FPD) in accordance with the present invention.

FIG. 1 illustrates a block diagram of an exemplary FPD 100 according to the present invention. I/O nodes 102 may represent external pins of an Integrated Circuit (IC), or alternatively, I/O nodes 102 may represent interconnect pads located on the semiconductor die (not shown), which are then either externally interconnected via I/O nodes 102, or conversely internally connected to other connection pads of the semiconductor die.

Multiple macrocells 106 may be grouped into logic blocks 108, where each logic block 108 may include any number of macrocells 106. The configuration of each macrocell 106 may include a set of product terms, e.g., as generated by an AND-plane, that may feed a multiple input logic OR/XOR function and a programmable flip flop function.

Alternative configurations of macrocell 106 may include multiple PAL devices that provide, for example, a programmable AND-plane followed by a fixed OR-plane. Conversely, macrocell 106 may include multiple PLA devices that incorporate both a programmable AND-plane and a programmable OR-plane. Still other implementations of macrocell 106 may include an array of Arithmetic Logic Units (ALU) that receive inputs from an OR-plane, whereby the ALU may produce any function of its respective logically ORed inputs and may provide its output to a configurable flip flop device. It should be readily apparent to one of ordinary skill in the art that the present invention may provide advantages to any FPD irregardless of its particular macrocell implementation.

Programmable Interconnect Array (PIA) 104 is capable of routing any I/O 102 node to any other I/O 102 node. PIA 104 is also capable of routing any input or output of any macrocell 106 to any other macrocell 106. Thus, PIA 104 forms an adaptable wired interconnect between each of I/O nodes 102, and logic blocks 108 to form a highly programmable logic device that is configurable by the end user. The interconnection defined by one instantiation of PIA 104 may be easily modified by the end user to yield virtually unlimited configuration options.

Additionally, PIA 104 is indirectly coupled to Dedicated Logic Block (DLB) 110 via signal lines 112 and 118 and directly coupled to DLB 110 via signal line 122. Thus, in addition to providing virtually unconditional flexibility of I/O 102 and logic block 108 inter-connectivity, PIA 104 also provides connectivity between the various I/O nodes 102, logic blocks 108 and to DLB 110 via the indirect connections 112 and 118 to DLB 110, as well as the direct connection 122 to DLB 110.

FPD 100 additionally provides interconnection to DLB 110 such that I/O pads 102 may be used to bypass the interconnectivity provided by PIA 104. In particular, direct connections to DLB 110 are provided to external I/O pads 102 via signal lines 114, 116, and 120. As such, virtually any dedicated logic function implemented by DLB 110 may be accessed via I/O pads 102, without first traversing PIA 104. Furthermore, DLB 110 may be implemented without unnecessarily utilizing the programmable resources offered by macrocells 106.

Figure 2A:
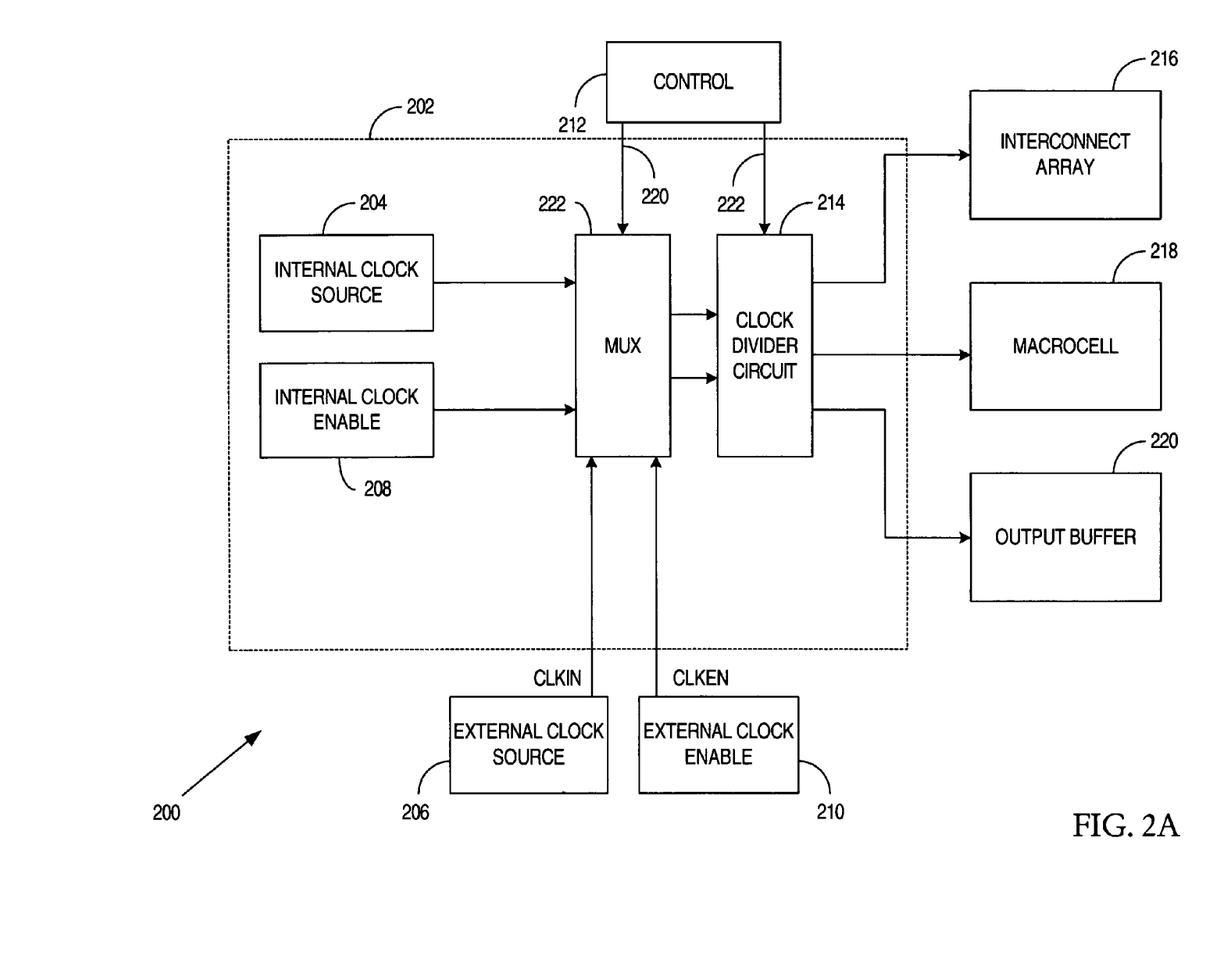
FIG. 2A illustrates an exemplary block diagram of the dedicated logic block of FIG. 1.

FIG. 2A illustrates an exemplary block diagram 200, whereby DLB 202 represents a dedicated clock divider in accordance with the present invention. Dedicated clock divider 202 is incorporated within FPD 100 according to the present invention, such that a number of advantages may be realized through the expanded interconnectivity and functionality that is provided by dedicated clock divider 202.

In particular, either an internal clock source 204 or an external clock source 206 may be selected as the source of the clock signal that is to be divided by dedicated clock divider 202. Dedicated clock divider 202 may also be enabled either internally, via internal clock enable 208, or externally, via external clock enable 210. Multiplexer (MUX) 222 provides the multiplexing network that selects between external or internal clock sources and external or internal clock enable signals, whereby control 212 provides the control signal 220 to effect such input signal discrimination.

Control 212 additionally provides control signal 222 to clock divider circuit 214. In other words, the divided clock signal CLKDIV generated by clock divider circuit 214 may be directed to any one or more of interconnect array 216, macrocell 218, and/or output buffer 220. Control 212 may be implemented via, for example, any one of macrocells 106 as illustrated in FIG. 1. Since macrocells 106 exist within user programmable logic blocks 108, the operation of dedicated clock divider 202 may be directed by the user.

Hence, dedicated clock divider 202 provides user controlled connectivity and functionality that enables, for example: user directed power control via clock enable to clock divider 214; programmability of clock divide by ratios via user programmable logic; and cascadability of the divided clock output for further control of clock divide by ratios. Output buffer 220 also provides external fan out of the divided clock signal from dedicated clock divider 202 to other integrated circuits (not shown) or function blocks that require the divided clock signal.

Figure 2B:
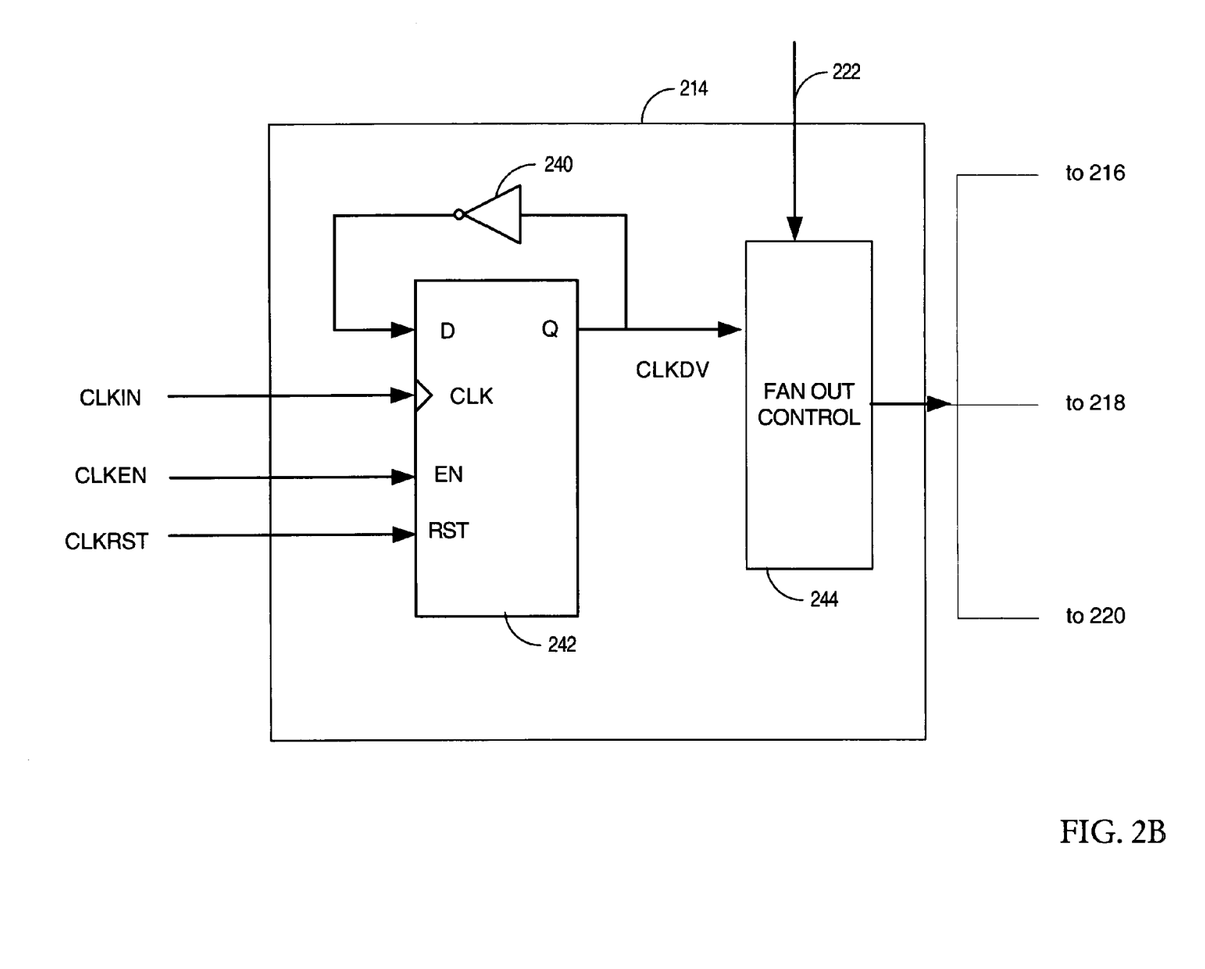
FIG. 2B is an illustrative schematic of the clock divider circuit of FIG. 2A of an embodiment of the present invention.

FIG. 2B is an illustrative schematic of the clock divider circuit 214 of FIG. 2A of an embodiment of the present invention. Clock divider circuit 214, in an exemplary embodiment of the present invention, is hardwired circuitry embedded in the FPD 100. The inputs to clock divider circuit 214 are the input clock CLKIN, that is selected by MUX 222 from the internal clock source 204 or external clock source 206, the enable signal CLKEN, that is selected by MUX 222 from the internal clock enable 208 or external enable source 210, and the reset signal CLKRST. The output of clock divider circuit 214 is the divided clock signal CLKDV. CLKDV signal is input into fan out control circuit 244 which then distributes the divided clock to any one or more of the interconnect array 216, macrocell 218, or output buffer 220. For illustration purposes a divide by two circuit having a D flip flop 242 and an inverter 240 connecting the output Q of D flip flop 242 back to the input D is shown in FIG. 2B. The clock enable CLKEN signal allows CLKDV to be stopped in a 1 or 0 state, unlike using the CLKRST which resets CLKDIV to 0. The clock enable CLKEN signal also allows a pause in the divided clock signal CLKDIV for a predetermined duration of time. Thus there are advantages of having a CLKEN signal over only having a CLKRST signal.

Figure 3:
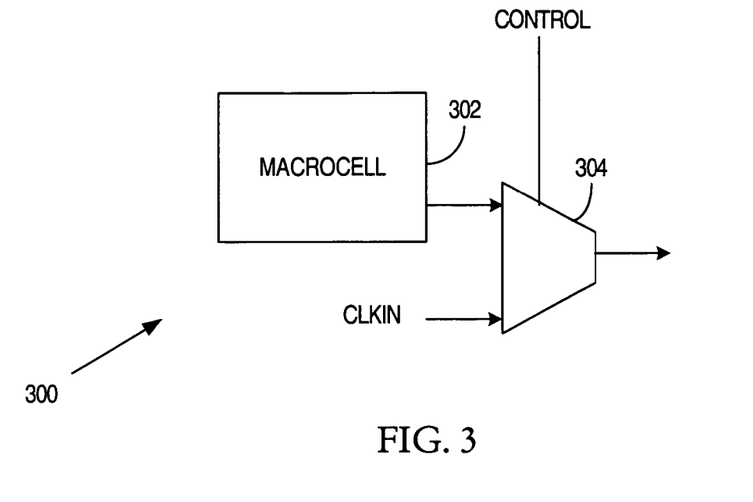
FIG. 3 illustrates an exemplary block diagram of a clock input discriminator according to the present invention.

FIG. 3 provides an exemplary block diagram of clock input discriminator 300 implemented within MUX 222 of FIG. 2A according to the present invention. Clock input discriminator 300 operates to allow user programmable selection of either an internal clock signal, e.g., via macrocell 302, or an external clock signal, e.g., CLKIN, to be applied to clock divider 214 of FIG. 2A. Clock input discriminator 300 implements, for example, a two-input multiplexer 304 that accepts external clock input signal, CLKIN, and an internally routed clock input signal via macrocell 302. Selection between the two clock input signals occurs in response to signal CONTROL, which is generated, for example, via control 212 of FIG. 2A. Macrocell 302 may exist within any of logic blocks 108 of FIG. 1, thus the clock signal provided by macrocell 302 may represent a user programmable clock signal that may have traversed a global clock distribution network (not shown) contained within FPD 100.

Figure 4:
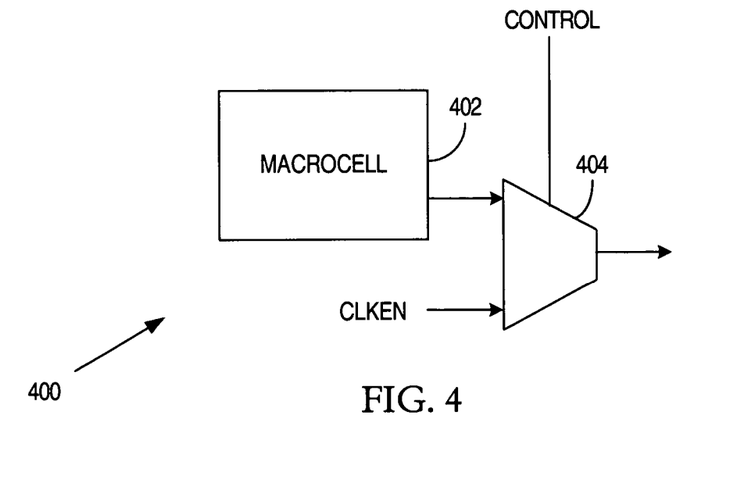
FIG. 4 illustrates an exemplary block diagram of a clock enable discriminator according to the present invention.

FIG. 4 provides an exemplary block diagram of clock enable discriminator 400 implemented within MUX 222 of FIG. 2A according to the present invention. Clock enable discriminator 400 implements a two-input multiplexer 404 accepting external clock enable signal, e.g., CLKEN, and an internally routed clock enable signal via, e.g., macrocell 402. Selection between the two clock enable signals occurs in response to signal CONTROL, which is generated, for example, via control 212 of FIG. 2A. Macrocell 402 may exist within any of user programmable logic blocks 108 of FIG. 1, thus the clock enable provided by macrocell 402 may represent, for example, the output of a user defined FSM (not shown), or other user programmable logic function.

Figure 5:
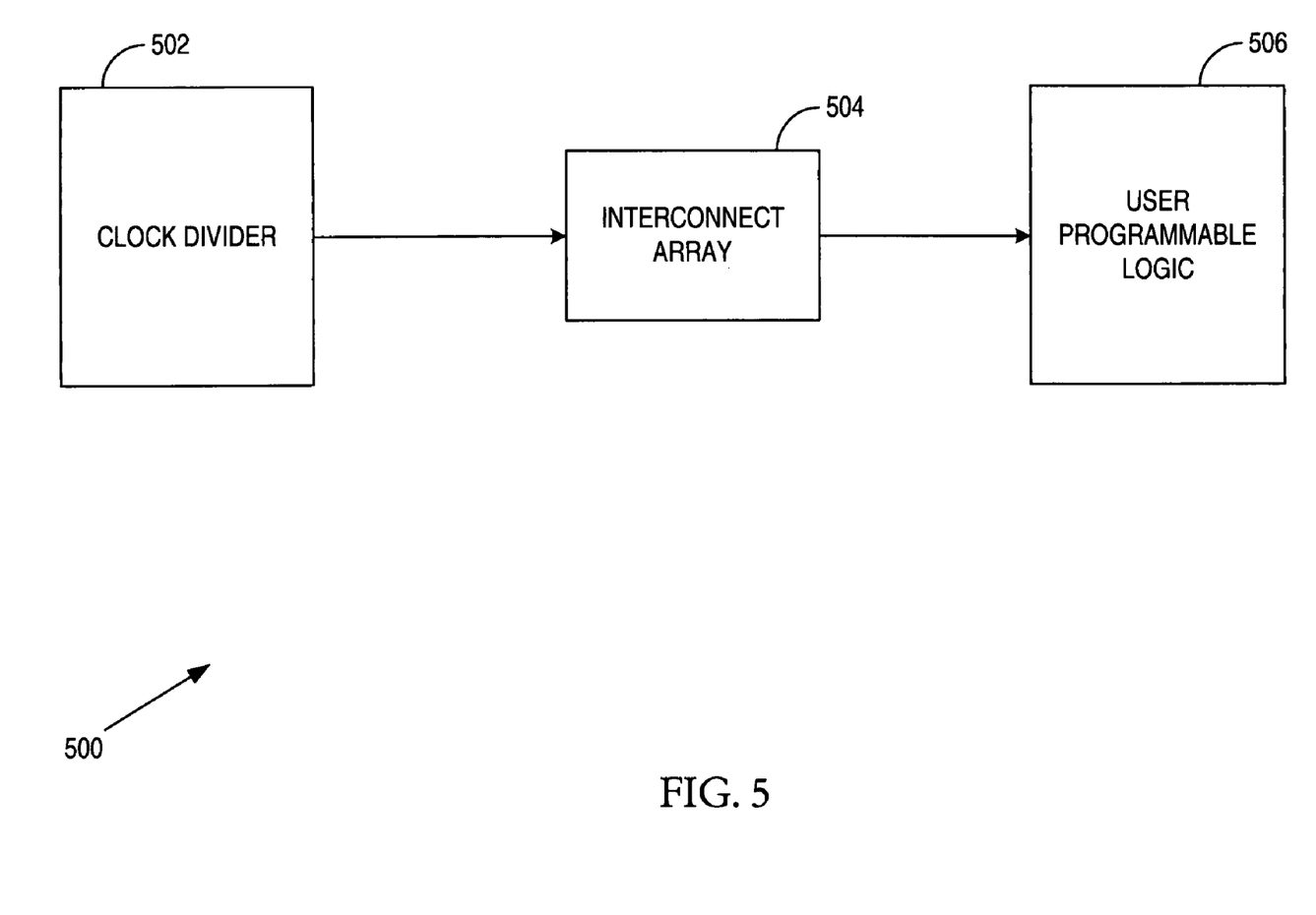
FIG. 5 illustrates an exemplary interconnection diagram in accordance with the present invention.

FIG. 5 illustrates an exemplary interconnection according to the present invention, in which the output of dedicated clock divider 502 is routed through interconnect array 504 to user programmable logic 506. Such an interconnection allows the user to manipulate the output of dedicated clock divider 502 via logic that is internal to the FPD, e.g., macrocells 106 of FIG. 1. Accordingly, the user is able to expand upon the number of divide by ratios that are available from clock divider 502 to a virtually unlimited number of divide by ratios through the use of user programmable logic 506.

Figure 6:
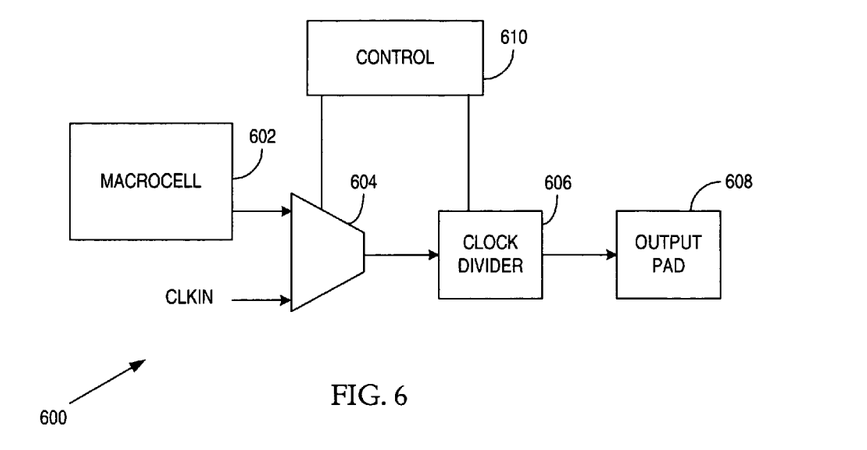
FIG. 6 illustrates an additional exemplary interconnection diagram in accordance with the present invention.

FIG. 6 illustrates an exemplary interconnection according to the present invention, in which the clock input is selectable between an internally generated clock input via, e.g., macrocell 602, or external clock input, e.g., CLKIN. Further, the output of dedicated clock divider 606 is selected by CONTROL 610 to route to output pad 608, whereby the divided clock signal becomes accessible to external logic. Such an interconnection allows the user to provide the output of dedicated clock divider 606 from within FPD 202 to external ICs, such as other FPDs for example, that may require the divided clock signal for their particular use.

Figure 7:
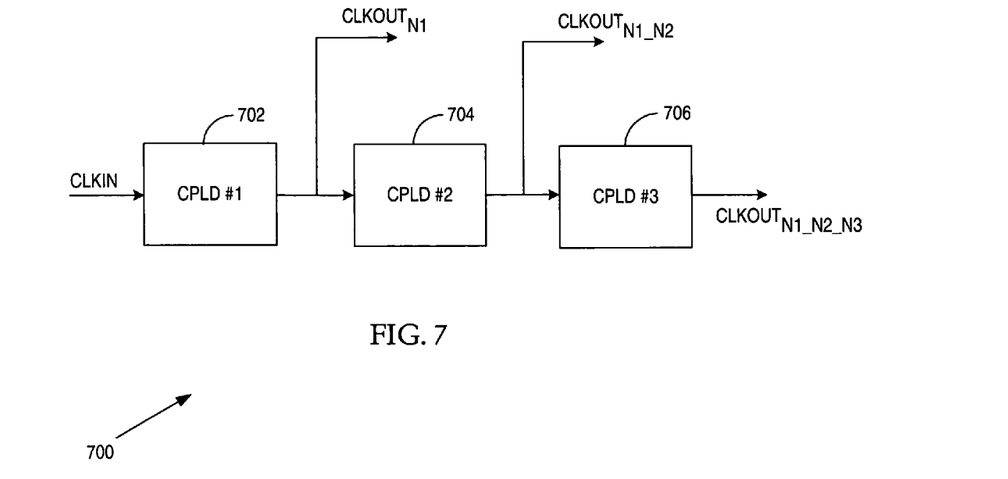
FIG. 7 illustrates a block diagram of dedicated clock dividers cascaded in accordance with the present invention.

FIG. 7 illustrates cascade 700, whereby FPDs, e.g., CPLDs 702–706, are cascaded to provide three separate and distinct clock signals, e.g., $CLKOUT_{N1}$, $CLKOUT_{N1\_N2}$, and $CLKOUT_{N1\_N2\_N3}$. The output of CPLD #1 702 provides the external clock input to CPLD #2 704 via the output pad of CPLD #1 702, e.g., output pad 608, as illustrated in FIG. 6. Similarly, the output of CPLD #2 704 provides the external clock input to CPLD #3 706 via the output pad of CPLD #2 704.

Thus, $CLKOUT_{N1}$ is related to CLKIN according the divide ratio provided by CPLD #1 through its dedicated clock divider. Similarly, $CLKOUT_{N1\_N2}$ is related to $CLKOUT_{N1}$ according to the divide ratio provided by CPLD #2 through its dedicated clock divider. Further, $CLKOUT_{N1\_N2\_N3}$ is related to $CLKOUT_{N1\_N2}$ according the divide ratio provided by CPLD #3 through its dedicated clock divider. The user is therefore able to expand upon the number of divide by ratios available within the system by cascading N dedicated clock dividers imbedded within up to N CPLDs to provide a total of N dedicated clock signals each operating at different frequencies.

Applications for dedicated clock dividers implemented internally to FPDs are virtually limitless. For example, on-chip clock signal division as well as cascaded clock signal division may be implemented with medium scale FPDs, such as CPLDs, to realize the clock divide ratios for use in a Phase Locked Loop (PLL) based clock generation circuit.

Figure 8:
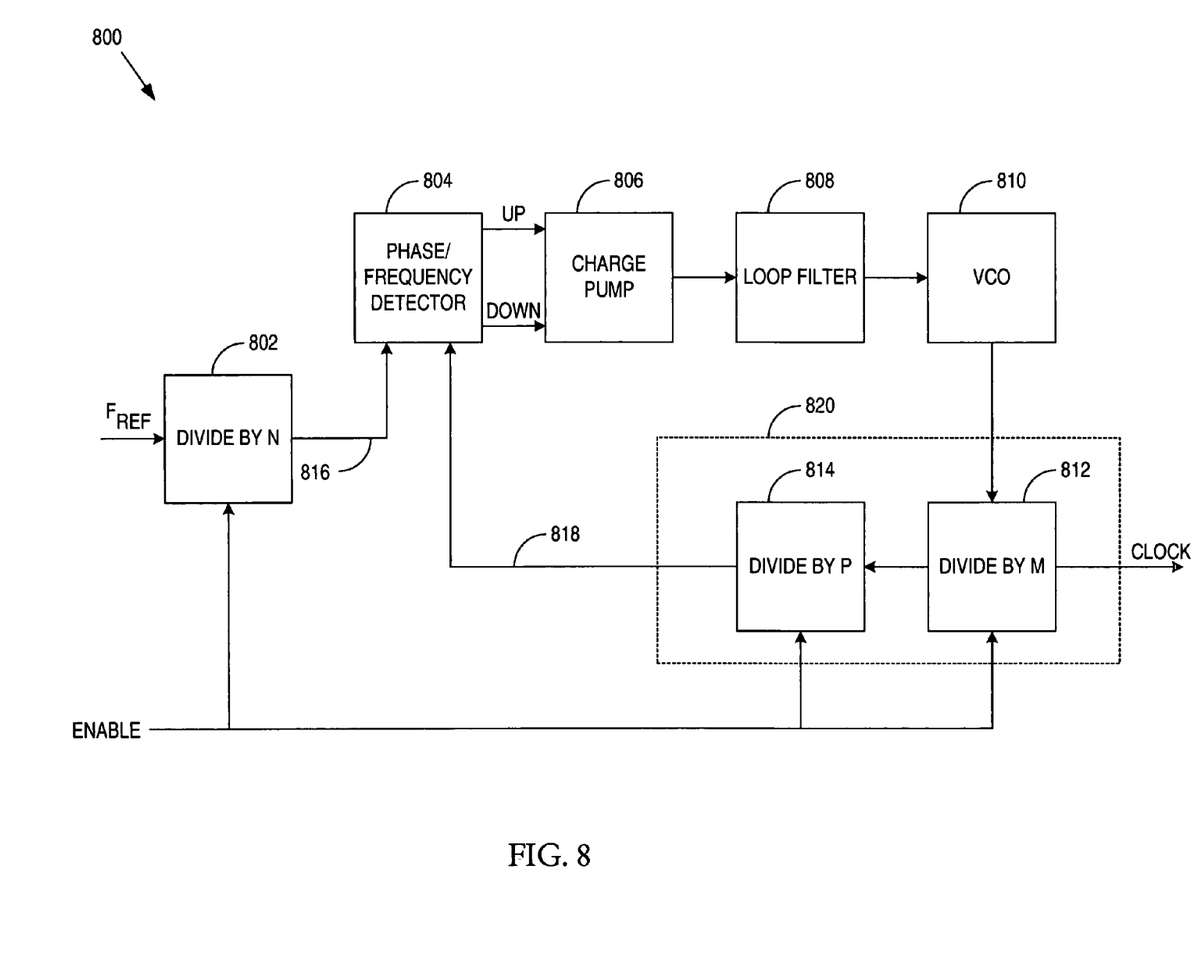
FIG. 8 illustrates an exemplary Phase Locked Loop (PLL) based clock distribution system in accordance with the present invention.

FIG. 8 illustrates exemplary system 800 that implements a PLL based clock generation circuit to provide signal, CLOCK, that is phase coherent with a reference signal, $F_{REF}$. In particular, phase/frequency detector 804 receives two signals: a divided version of the reference frequency, $F_{REF}/N$, via path 816 from divide-by-N 802; and a divided version of the Voltage Controlled Oscillator (VCO) frequency, $F_{VCO}/(M*P)$, via path 818 from cascaded divide block 820. The operation of phase/frequency detector 804 compares the frequency and phase of signals 816 and 818 and provides error signals, UP and DOWN, in response to the comparison.

Coarse adjustments are made by phase/frequency detector 804 in relation to the frequency difference between the signals on path 816 and 818. If, for example, the frequency of signal 816 is higher than the frequency of signal 818, then signal UP is in a dominate active state with respect to signal DOWN, e.g., the pulse width of signal UP is wider than the pulse width of signal DOWN. In such an instance, charge pump 806 reacts to the dominant UP signal by increasing its output control current. Loop filter 808 integrates the increasing control current to provide a larger control voltage to VCO 810. In response to the increased control voltage, VCO 810 generates a higher frequency signal to divide-by-M 812 and ultimately a higher frequency signal 818 to phase/frequency detector 804. The UP signal continues to dominate the DOWN signal until the frequencies of signals 816 and 818 are substantially equal.

If, on the other hand, the frequency of signal 816 is lower than the frequency of signal 818, then signal DOWN is in a dominate active state with respect to signal UP, e.g., the pulse width of signal DOWN is wider than the pulse width of signal UP. In such an instance, charge pump 806 reacts to the dominant DOWN signal by decreasing its output control current. Loop filter 808 integrates the decreasing control current to provide a smaller control voltage to VCO 810. In response to the decreased control voltage, VCO 810 generates a lower frequency signal to divide-by-M 812 and ultimately a lower frequency signal 818 to phase/frequency detector 804. The DOWN signal continues to dominate the UP signal until the frequencies of signals 816 and 818 are substantially equal.

Fine adjustments are similarly made by phase/frequency detector 804 in relation to the phase difference between signals 816 and 818. If, for example, the phase of signal 818 lags the phase of signal 816, then the active state of signal UP dominates the active state of signal DOWN, which serves to advance the phase of signal 818 with respect to the phase of signal 816 through feedback generated by charge pump 806, loop filter 808, VCO 810, divide-by-M 812, and divide-by-P 814.

If, on the other hand, the phase of signal 818 leads the phase of signal 816, then the active state of signal DOWN dominates the active state of signal UP, which serves to retard the phase of signal 818 with respect to the phase of signal 816 through feedback generated by charge pump 806, loop filter 808, VCO 810, divide-by-M 812, and divide-by-P 814 as discussed above.

Thus, PLL based frequency synthesizer 800 tracks both the frequency and phase of reference signal $F_{REF}$ to create signal CLOCK, which is in a frequency/phase coherent relationship with signal $F_{REF}$. The frequency of signal CLOCK is proportionate to signal $F_{REF}$ as follows: $F_{CLOCK}=F_{REF} * (M*P/N)$, where $F_{CLOCK}$ is the frequency of signal CLOCK, P is the dividing ratio of divide-by-P 814 and N is the dividing ratio of divide-by-N 802.

Divide block 820 provides a divided clock signal 818, whereby the aggregate divide ratio is equal to the product of the divide by ratios provided by divide-by-P 814 and divide-by-M 812. Divide block 820, therefore, illustrates an exemplary application of the cascade of dedicated clock dividers as illustrated by FIG. 7. Divide-by-M 812, for example, may relate to CPLD #1 702, whereby the CLKIN signal relates to the output of VCO 810. Signal CLOCK of FIG. 8 relates to signal $CLKOUT_{N1}$ of FIG. 7, which is also routed to divide-by-P 814 of FIG. 8. Divide-by-P 814 relates to CPLD #2 704 of FIG. 7, whereby signal 818 of FIG. 8 relates to $CLKOUT_{N1\_N2}$ of FIG. 7. Thus, divide-by-P 814 and divide-by-M 812 of FIG. 8 may be implemented through the cascade of two CPLD devices, having internal, dedicated clock division circuits in accordance with the present invention, to yield the desired aggregate clock divide ratio.

In addition, divide-by-N 802 of FIG. 8 may relate to the dedicated clock divider 600 of FIG. 6. In particular, MUX 602 is selected to receive external clock signal CLKIN, which corresponds to signal $F_{REF}$ of FIG. 8, that is received via external I/O pin 102 as exemplified by path 114 of FIG. 1. Dedicated clock divider 606 subsequently divides signal $F_{REF}$ in accordance with the divide ratio control signal received from control 610. The divided clock signal is then provided to output pad 608, which relates to I/O pad 102 via path 120 of FIG. 1, and is ultimately provided to path 816 of FIG. 8. Thus, divide-by-N is a divide ratio that may also be implemented, for example, by a dedicated clock divider of a CPLD.

Another advantage exemplified by system 800 is the ability to enable/disable the dedicated clock dividers of CPLDs 802, 812, and 814 via signal ENABLE. In particular, signal ENABLE may correspond to the external enable signal CLKEN of FIG. 4, or may correspond to the internal enable signal that is generated by macrocell 402. MUX 404, which is internal to CPLDs 802, 812, and 814, then provides signal ENABLE to the dedicated clock dividers which are also internal to CPLDs 802, 812, and 814, to either enable or disable them. In this way, the user controls the amount of power dissipated by the dedicated clock dividers of CPLDs 802, 812, and 814 through user programmable logic.

The present invention is believed to be applicable to a variety of clock/signal distribution systems. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. In an integrated circuit having a plurality of Input/Output (I/O) pins, a programmable logic device coupled to the I/O pins to provide dedicated and configurable logic functions, the programmable logic device comprising:

a plurality of logic blocks coupled to receive first input signals from the I/O pins and coupled to provide first output signals having a logical relationship to the first input signals in accordance with a user defined configuration;

a programmable interconnect array coupled to receive the first output signals and coupled to distribute the first output signals in accordance with the user defined configuration; and a dedicated logic block coupled to receive second input signals from the I/O pins and coupled to provide second output signals in accordance with the dedicated function, wherein the second input and output signals bypass the programmable interconnect array; and wherein the dedicated logic block includes a dedicated clock divider coupled to receive a clock signal at a first frequency and coupled to provide a clock signal at a second frequency; and wherein the dedicated clock divider is coupled to provide the clock signal at the second frequency in response to a clock enable signal.

2. The programmable logic device according to claim 1, wherein the dedicated clock divider further comprises a signal discriminator coupled to provide the clock enable signal and the clock signal at the first frequency to the dedicated clock divider in response to first and second control signals.

3. The programmable logic device according to claim 2, wherein the signal discriminator comprises a first multiplexer coupled to receive an internal and an external clock signal and coupled to select between the internal and external clock signals in response to the first control signal, wherein the external clock signal is received from one of the plurality of I/O pins.

4. The programmable logic device according to claim 3, wherein the signal discriminator further comprises a second multiplexer coupled to receive an internal and an external clock enable signal and coupled to select between the internal and external clock enable signals in response to the second control signal, wherein the external clock enable signal is received from one of the plurality of I/O pins.

5. In a Programmable Logic Device (PLD), a dedicated clock divider module coupled to receive an input clock signal and a clock enable signal and coupled to provide a divided clock signal, the dedicated clock divider module comprising:
    a first multiplexer coupled to receive internal and external input clock signals and arranged to select between the internal and external input clock signals in response to a first select signal;
    a second multiplexer coupled to receive internal and external clock enable signals and arranged to select between the internal and external clock enable signals in response to a second select signal; and
    a clock divider circuit coupled to receive a clock signal selected by the first select signal and coupled to provide the divided clock signal in response to the selected clock enable signal, wherein the first and second select signals are generated by internal user programmable logic.

6. The dedicated clock divider module of claim 5, wherein the output block is adapted to provide the divided clock signal to an externally accessible output pad of the CPLD.

7. The dedicated clock divider module of claim 6, wherein the output block is adapted to provide the divided clock signal to a logic block of the CPLD.

8. The dedicated clock divider module of claim 7, wherein the output block is adapted to provide the divided clock signal to a programmable interconnect array of the CPLD.

9. The dedicated clock divider module of claim 5 wherein the clock divider circuit comprises hardwired circuitry to divide a frequency of the input clock signal, when the clock enable signal is asserted.

10. A method of providing a divided clock signal from a dedicated clock divider contained within a programmable logic device, the method comprising:
    selecting between clock signals that are internal and external to the programmable logic device;
    applying the selected clock signal to the dedicated clock divider; and
    providing the divided clock signal by enabling the dedicated clock divider through selection of one of internal or external clock enable signals, wherein applying the selected clock signal and providing the divided clock signal bypasses a programmable interconnect array contained within the programmable logic device.

11. The method according to claim 10, wherein providing the divided clock signal includes providing the divided clock signal to an output pad externally accessible from the programmable logic device.

12. The method according to claim 11, wherein providing the divided clock signal includes providing the divided clock signal to user programmable logic contained within the programmable logic device.

13. A Programmable Logic Device (PLD) having Input/Output (I/O) pads, logic blocks, and a programmable interconnect array, the PLD comprising:
    means for selecting between a clock signal generated internally to the PLD and a clock signal received external to the PLD via a first I/O pad;
    means for selecting between a clock enable signal generated internally to the PLD and a clock enable signal received external to the PLD via a second I/O pad; and
    means for generating a divided clock signal from the selected clock signal in response to the selected enable signal, wherein the selected clock signal and the divided clock signal bypass the programmable interconnect array.

* * * * *